(12) United States Patent
Kishimoto et al.

(10) Patent No.: US 11,567,614 B2
(45) Date of Patent: Jan. 31, 2023

(54) FLEXIBLE DISPLAY DEVICE INCLUDING SENSING FILM AND METAL PLATE BELOW THE SENSING FILM

(71) Applicant: Samsung Display Co., Ltd., Yongin-si (KR)

(72) Inventors: Hirotsugu Kishimoto, Yongin-si (KR); Cheol Ho Choi, Yongin-si (KR); Hyun Been Hwang, Yongin-si (KR); Chul Ho Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/120,502

(22) Filed: Dec. 14, 2020

(65) Prior Publication Data
US 2021/0333934 A1 Oct. 28, 2021

(30) Foreign Application Priority Data

Apr. 23, 2020 (KR) .................. 10-2020-0049503

(51) Int. Cl.
*G06F 3/044* (2006.01)
*G06F 3/0354* (2013.01)
*H01L 27/32* (2006.01)

(52) U.S. Cl.
CPC ........ *G06F 3/0443* (2019.05); *G06F 3/03545* (2013.01); *G06F 3/0442* (2019.05); *G06F 2203/04102* (2013.01); *H01L 27/322* (2013.01); *H01L 27/323* (2013.01); *H01L 27/3244* (2013.01)

(58) Field of Classification Search
CPC .......................... G06F 3/0443; G06F 3/03545
See application file for complete search history.

(56) References Cited

U.S. PATENT DOCUMENTS

| | | | |
|---|---|---|---|
| 2011/0095999 A1* | 4/2011 | Hayton | G06F 3/0446 345/173 |
| 2012/0049309 A1* | 3/2012 | Kiyomoto | G06K 19/0718 257/434 |
| 2015/0241991 A1* | 8/2015 | Shimizu | G06F 3/0421 345/175 |
| 2015/0338935 A1* | 11/2015 | Shimizu | G06F 3/0428 345/179 |
| 2019/0131553 A1* | 5/2019 | Park | G02F 1/133305 |
| 2019/0174640 A1* | 6/2019 | Park | H05K 5/0017 |
| 2019/0227692 A1* | 7/2019 | Kim | G06F 3/041 |
| 2020/0076940 A1* | 3/2020 | Kim | G06F 1/1656 |
| 2020/0166974 A1* | 5/2020 | Ai | G06F 1/1641 |

OTHER PUBLICATIONS

The Great Soviet Encyclopedia, Soft-Magnetic Materials, Article about Soft-Magnetic Materials by The Free Dictionary, https://encyclopedia2.thefreedictionary.com/Soft-Magnetic+Materials, Jul. 17, 2019, 3 pages.

* cited by examiner

*Primary Examiner* — Chun-Nan Lin
(74) *Attorney, Agent, or Firm* — Lewis Roca Rothgerber Christie LLP

(57) ABSTRACT

A flexible display device including a bending area and a plurality of non-bending areas may include a display substrate including a plurality of transistors and a light-emitting element, a sensing film below the display substrate, and a plurality of metal plates below the sensing film, and the metal plates include a soft magnetic material.

15 Claims, 17 Drawing Sheets

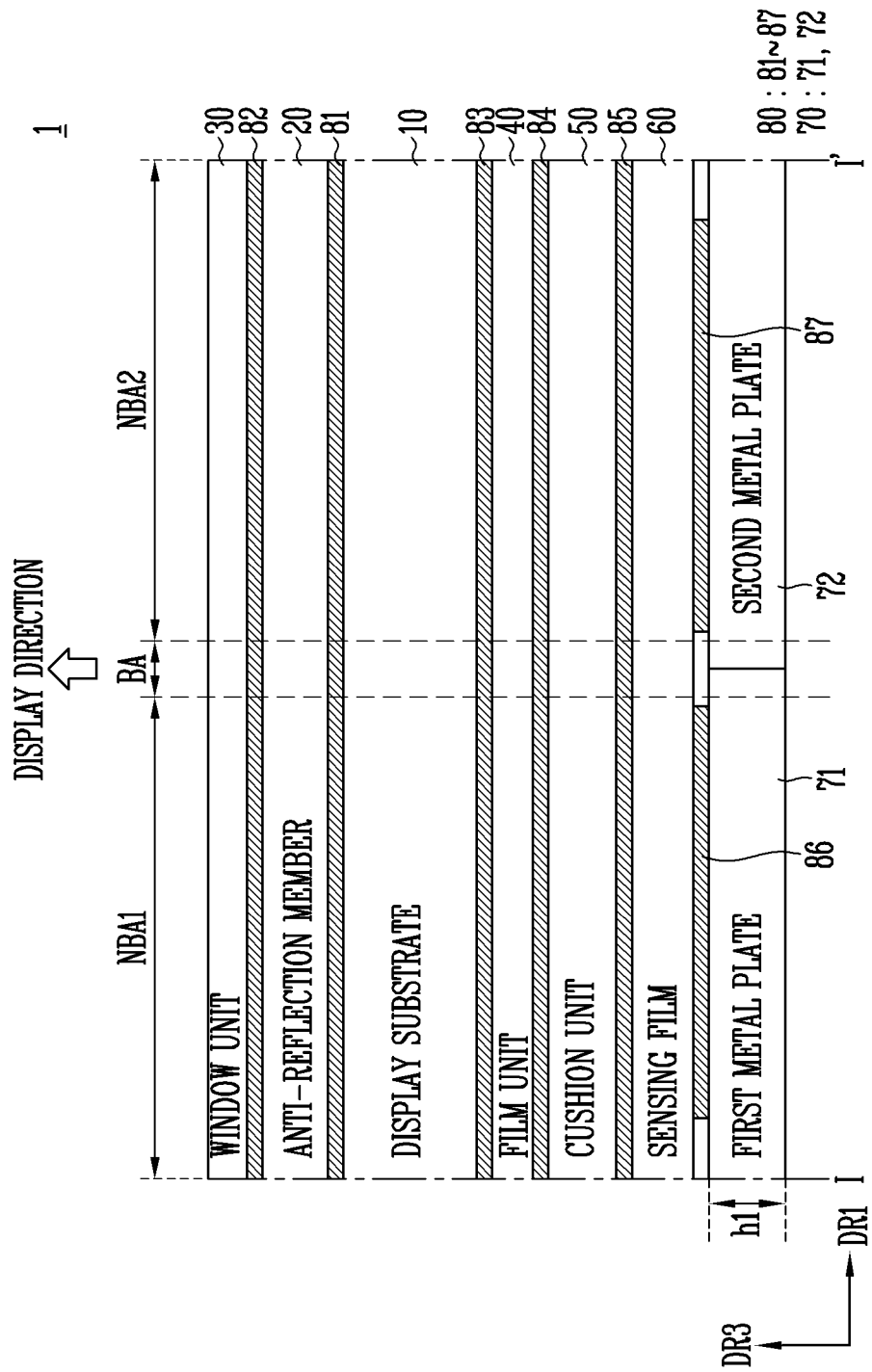

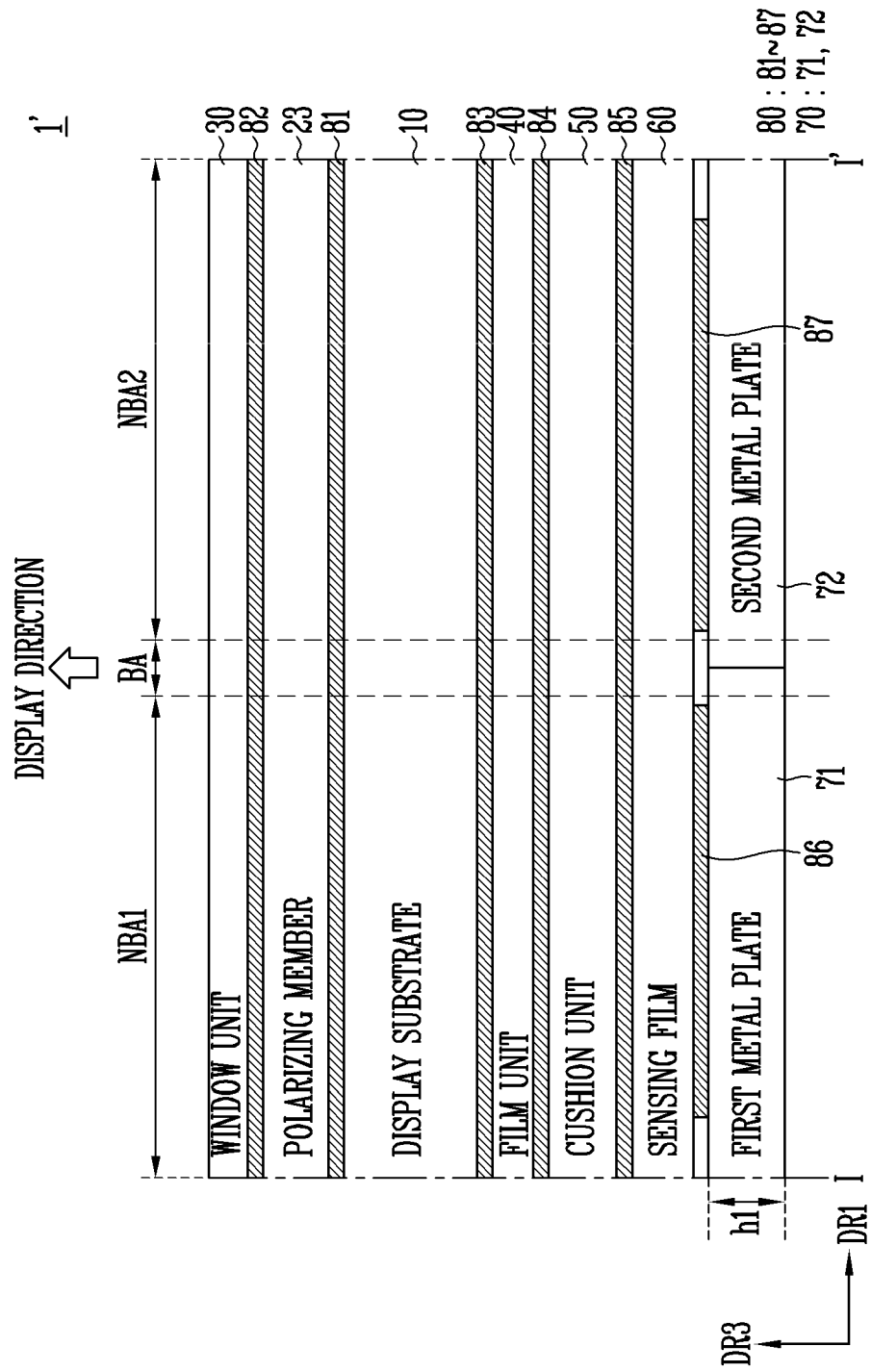

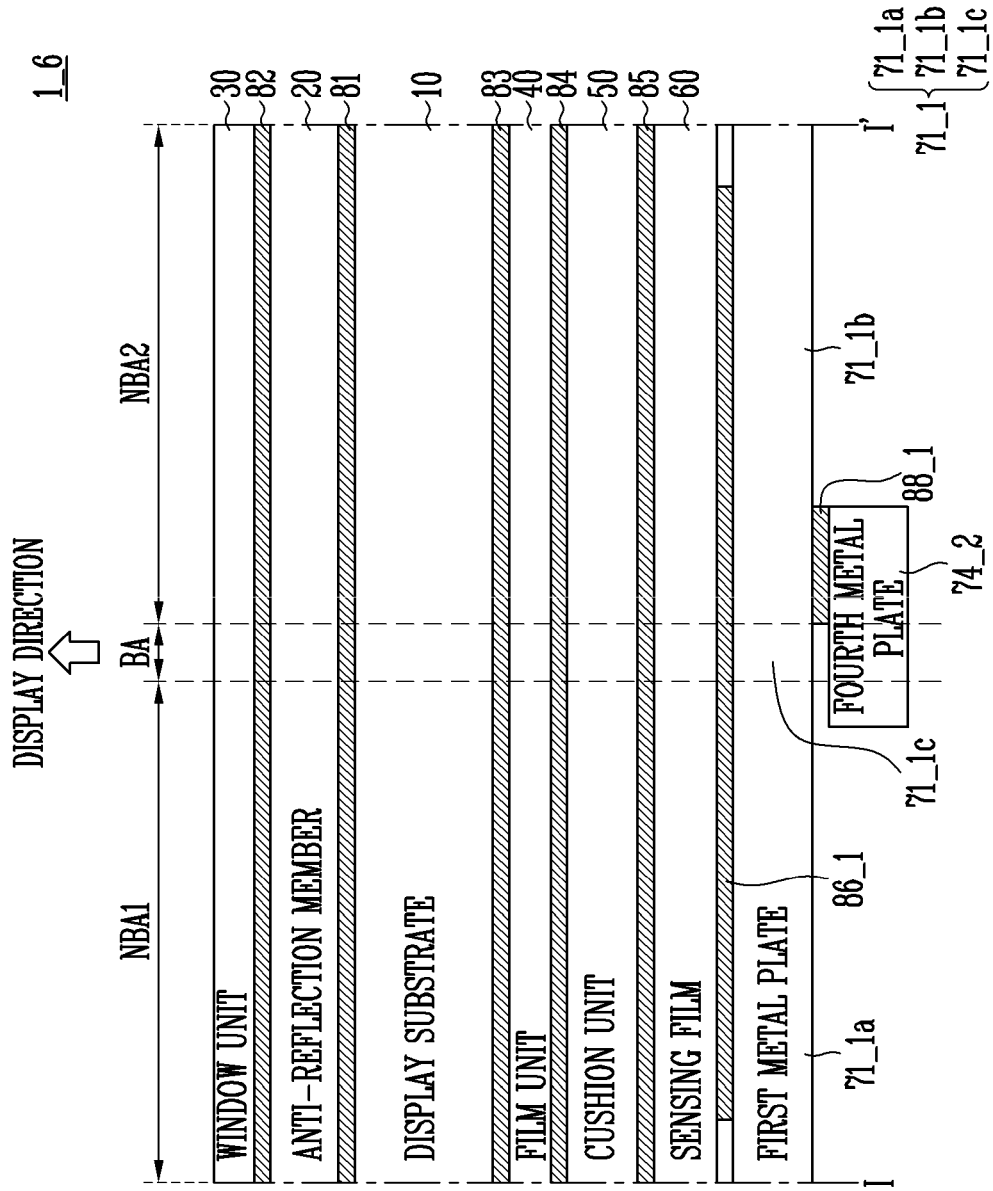

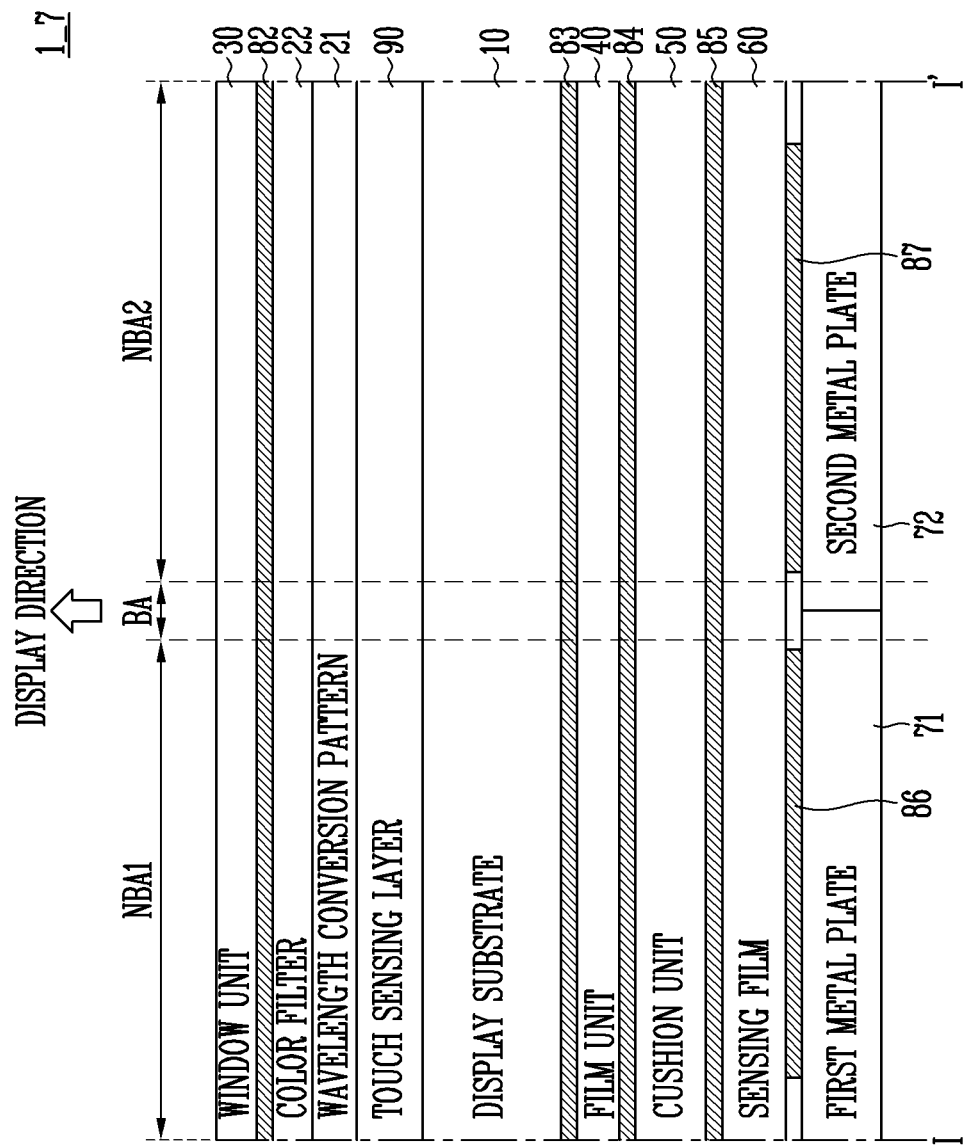

FLEXIBLE DISPLAY DEVICE INCLUDING SENSING FILM AND METAL PLATE BELOW THE SENSING FILM

CROSS-REFERENCE TO RELATED APPLICATION

This application claims priority to and the benefit of Korean Patent Application No. 10-2020-0049503, filed on Apr. 23, 2020 in the Korean Intellectual Property Office, the entire disclosure of which is incorporated herein by reference.

BACKGROUND

1. Field

Aspects of embodiments of the present disclosure relate to a flexible display device.

2. Description of Related Art

With the development of an information-oriented society, demand for a display device which displays an image has increased in various forms. Recently, various flat-panel display devices, such as a liquid crystal display device, a plasma display device, an organic light-emitting diode display device, an electrophoretic display device, a micro light-emitting diode (LED) display device, and a display device including an inorganic light-emitting element, such as a quantum-dot LED, have been utilized. In particular, since at least some of the above-described display devices may be implemented as a flat panel, research into technology for implementing the corresponding display devices as flexible display devices having flexibility has been continuously conducted.

A touch panel is an input device that inputs a user's command by allowing an instruction displayed on the screen of a display device or the like to be selected with the user's finger or an object. Since this touch panel is capable of replacing separate input devices, such as a keyboard and a mouse which are operated while being coupled to a display device, the range of use of the touch panel has been gradually expanded.

Generally, the touch panel may recognize a touch in a capacitive type, which is a scheme for detecting a change in capacitance and recognizing the position of a contact when the user's finger or an object comes into contact with the surface of the touch panel.

Meanwhile, there is a disadvantage in that, when the user's finger comes into contact with the surface of the touch panel and then a touch is recognized, a touch position may not be precisely recognized. In order to solve this disadvantage, research into an electronic pen (or a stylus pen) and a digitizer for recognizing an electronic pen has been actively conducted.

Recently, a digitizer in which a magnetic metal plate and a digitizer module disposed on the magnetic metal plate are arranged has been applied to a display device.

SUMMARY

According to an aspect of one or more embodiments of the present disclosure, a foldable flexible display device is provided. According to another aspect of one or more embodiments of the present disclosure, a flexible display device that includes a digitizer for recognizing an electronic pen is provided.

However, aspects of the present disclosure are not limited to the above-described aspects, and other aspects, not described herein, may be clearly understood by those skilled in the art from the following description.

According to one or more embodiments of the present disclosure, a flexible display device includes a bending area and a plurality of non-bending areas. The flexible display device may include a display substrate including a plurality of transistors and a light-emitting element, a sensing film below the display substrate, and a plurality of metal plates below the sensing film, wherein the metal plates include a soft magnetic material.

The plurality of non-bending areas may include a first non-bending area and a second non-bending area, the bending area being between the first non-bending area and the second non-bending area, and the plurality of metal plates may include a first metal plate configured to overlap with the first non-bending area, and a second metal plate configured to overlap with the second non-bending area.

Respective facing ends of the first metal plate and the second metal plate may come into contact with each other in a state in which the flexible display device is unfolded.

The respective facing ends may overlap with the bending area.

The plurality of metal plates may further include a third metal plate below the first metal plate.

Respective facing ends of the first metal plate and the second metal plate may be spaced apart from each other by an interval in a state in which the flexible display device is unfolded.

An end of the third metal plate may overlap with at least a part of the second metal plate.

The plurality of metal plates may further include a fourth metal plate below the second metal plate.

The sensing film may include a base film, a first sensing electrode on the base film, an insulating layer on the first sensing electrode, and a second sensing electrode on the insulating layer.

The flexible display device may have a repulsive force, a strength of which is from 14 N*cm to 20 N*cm at room temperature.

Each of the plurality of metal plates may have a thickness of 20 μm to 150 μm.

The sensing film may overlap with all of the bending area and the plurality of non-bending areas.

The sensing film may be configured to recognize an input of an electronic pen.

The soft magnetic material may include Invar, ferritic stainless steel, Permalloy, Perminvars, or Permendur.

According to one or more embodiments of the present disclosure, a flexible display device that is foldable may include a display substrate including a plurality of transistors and a light-emitting element, a sensing film below the display substrate, and at least one metal plate below the sensing film.

The at least one metal plate may include a lattice area in which a lattice pattern is defined.

The lattice area may have a width of 2 mm to 20 mm.

The flexible display device may further include an additional metal plate below the at least one metal plate, wherein the additional metal plate overlaps with the lattice area in a state in which the flexible display device is unfolded.

The flexible display device may further include a touch sensing layer on the display substrate.

The flexible display device may further include a wavelength conversion pattern on the touch sensing layer and including a quantum dot, and a color filter on the wavelength conversion pattern.

Other features and aspects of embodiments are included in the following detailed description and the drawings.

According to an aspect of embodiments of the present disclosure, a flexible display device may include a digitizer module.

Further, the flexible display device may include a digitizer module which does not separately have a magnetic metal plate.

Further, the flexible display device may be easily bent because a rise in repulsive force is minimized or reduced even if a digitizer module is included.

However, aspects and effects according to the embodiments are not limited by the above-mentioned aspects and effects, and various aspects and effects are included in the present specification.

BRIEF DESCRIPTION OF THE DRAWINGS

FIG. 4A is a schematic cross-sectional view of a flexible display device according to an embodiment of the present disclosure.

FIG. 4B is a cross-sectional view illustrating an application example of FIG. 4A.

FIG. 14 is a schematic cross-sectional view of a flexible display device according to an embodiment of the present disclosure.

FIG. 15 is a schematic cross-sectional view of a flexible display device according to an embodiment of the present disclosure.

DETAILED DESCRIPTION

Figure 1:
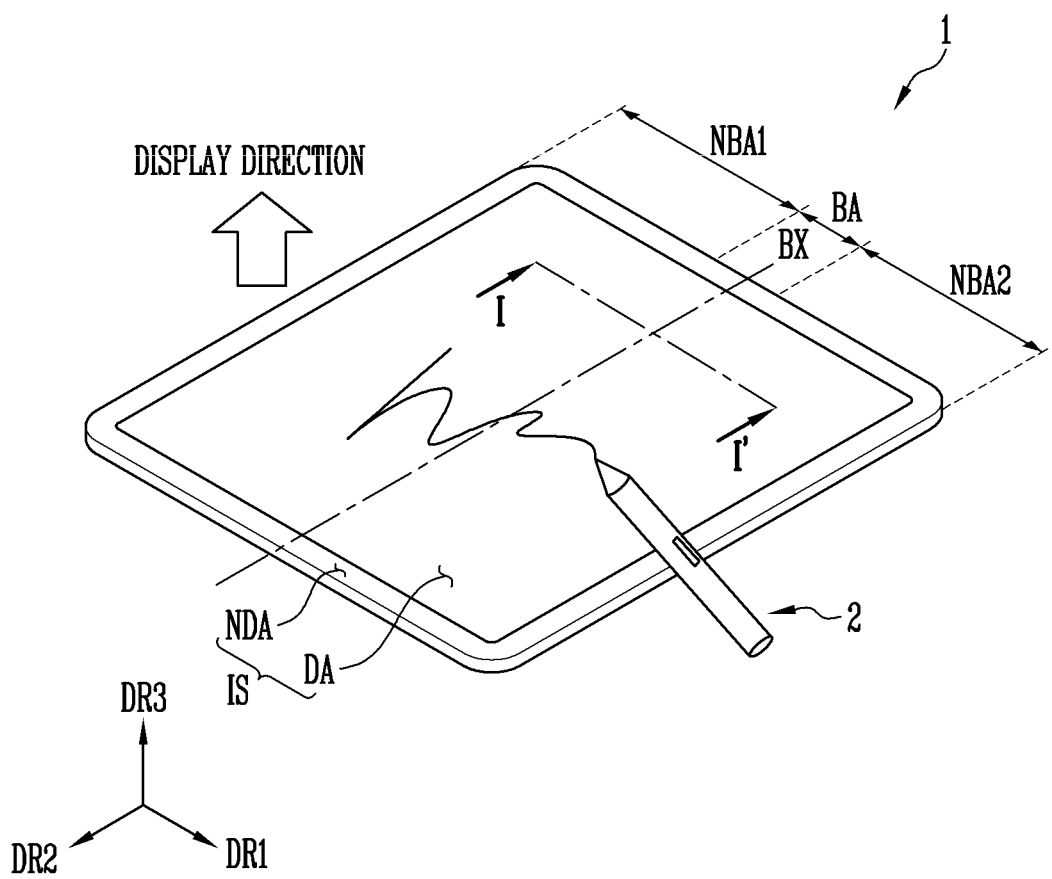
FIG. 1 is a view illustrating a flexible display device and an electronic pen according to an embodiment of the present disclosure.

Aspects and features of the present disclosure, and methods for achieving the same will be apparent with reference to some example embodiments described in further detail together with the accompanying drawings. However, the present disclosure may be implemented in various forms without being limited to the embodiments described herein, and the embodiments of the present disclosure are intended to make the disclosure of the inventive concept complete and are provided to help those skilled in the art to which the present disclosure pertains more clearly understand the scope of the present disclosure. The technical scope of the present disclosure should be defined by the technical spirit of the claims.

The terminology used herein is for the purpose of describing particular embodiments and is not intended to be limiting of the disclosure. As used herein, the singular forms are intended to include the plural forms as well, unless the context clearly indicates otherwise.

It is to be further understood that the terms "comprise" or "include" and/or "comprising" or "including," ("comprise," "comprising," "include," "including,") and/or "has," and variations thereof, when used in this specification, specify the presence of stated features, numbers, steps, operations, elements, and/or components, but do not preclude the presence or addition of one or more other features, numbers, steps, operations, elements, components, and/or groups thereof.

A case in which a first element or layer is designated as being disposed "on or above" a second element or layer may include all cases in which the first element or layer is disposed directly on the second element or layer and those in which one or more additional elements or layers intervene between the first and second elements or layers. Similarly, a case in which a first element or layer is designated as being disposed "below" a second element or layer may include all cases in which the first element or layer is disposed directly below the second element or layer and those in which one or more additional elements or layers intervene between the first and second elements or layers. Further, the terms "above" and "below" are not limited to specific terms, and may designate positions relative to each other.

Although the terms "first" and "second" are used to describe various components, it is to be understood that those components are not limited by the terms. These terms are used to distinguish one component from another component. Therefore, it is to be understood that a first component, which will be described below, may also be a second component without departing from the technical spirit of the present disclosure.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and are expressly defined herein unless they are interpreted in an ideal or overly formal sense.

Herein, some embodiments of the present disclosure will be described with reference to the attached drawings. The same or similar reference numerals are used to designate the same or similar components throughout the drawings. Also, in the accompanying drawings, sizes or thicknesses of various components may be exaggerated for brevity and clarity.

Figure 2:
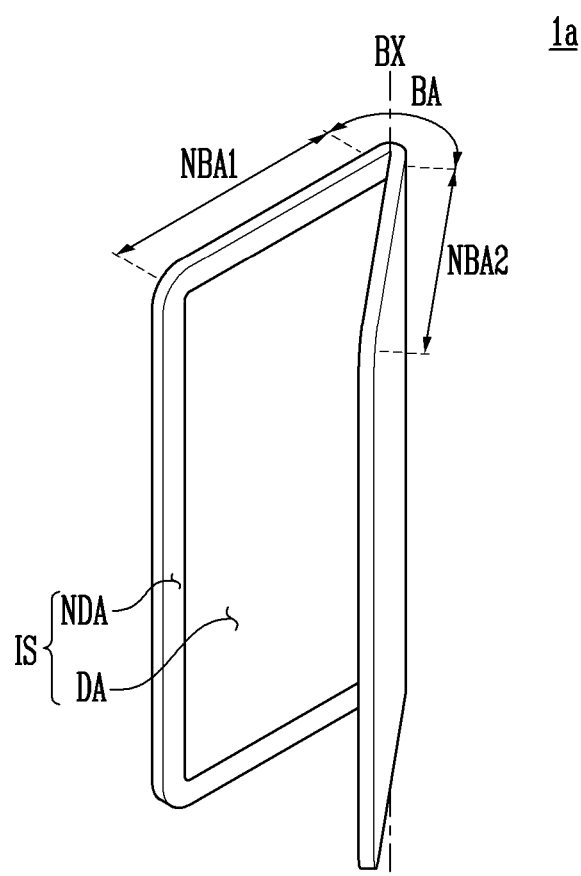
FIGS. 2 and 3 are views illustrating a state in which the flexible display device of FIG. 1 is folded.
Figure 3:
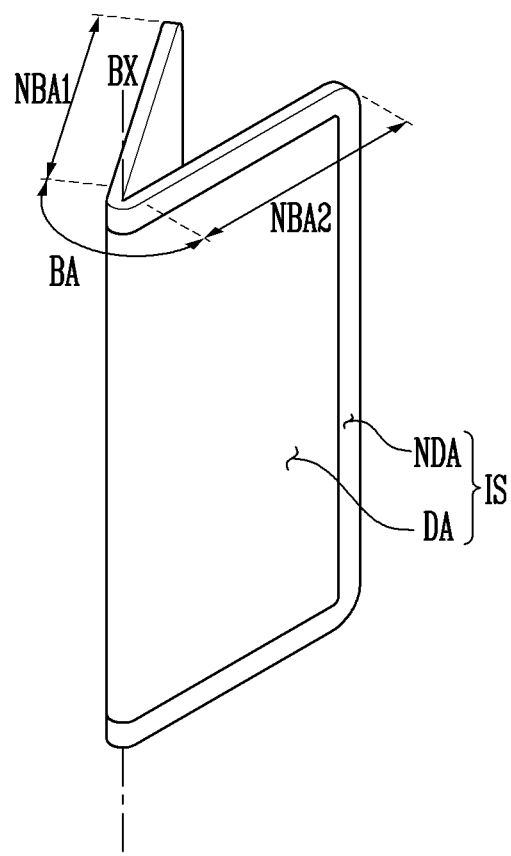

FIG. 1 is a view illustrating a flexible display device and an electronic pen according to an embodiment of the present disclosure; and FIGS. 2 and 3 are views illustrating a state in which the flexible display device of FIG. 1 is folded.

Meanwhile, FIG. 1 illustrates a state in which the flexible display device is spread out (unfolded) such that a display surface thereof is lying flat.

A flexible display device 1 illustrated in FIGS. 1 to 3 shows a foldable display device by way of example. However, the shape of the flexible display device 1 is not limited to the shape illustrated in FIG. 1, and the spirit and scope of the present disclosure may be applied to the flexible display device 1 as long as the flexible display device 1 is a display device including a portion in which tensile force or compressive force is produced by bending (or folding). That is, the spirit and scope of the present disclosure may also be applied to a display device that is bendable, and a rollable display device.

Herein, an organic light-emitting display device will be described as an example of the display device. However, the present disclosure is not limited thereto, but may be applied to other display devices, such as a liquid crystal display device, a field emission display device, an electrophoretic display device, a quantum dot light-emitting display device, or a micro LED display device, as long as the spirit of the present disclosure is not changed.

Referring to FIG. 1, a display surface IS on which an image is displayed in the flexible display device 1 may be parallel to a surface defined by a first direction DR1 and a second direction DR2. A direction of a normal line of the display surface IS, that is, a thickness direction of the flexible display device 1, is indicated by a third direction DR3. A top (or a top surface) and a bottom (or a bottom surface) of each of elements may be distinguished from each other by the third direction DR3.

In the present specification, the first direction DR1, the second direction DR2, and the third direction DR3 may be orthogonal to each other, and may correspond to an x-axis direction, a y-axis direction, and a z-axis direction, respectively. However, directions indicated by the first, second, and third directions DR1, DR2, and DR3 may be relative to each other, and may be changed to other directions.

In an embodiment, the flexible display device 1 may include a plurality of areas defined according to the operation form thereof. The flexible display device 1 according to an embodiment may include a bending area BA that may be bent on the basis of a virtual bending axis BX (see FIGS. 1 to 3), and non-bending areas NBA1 and NBA2 that are not bent.

The flexible display device 1 may include at least one bending area BA and one or more non-bending areas NBA1 and NBA2. Although a case in which the flexible display device 1 includes one bending area BA and two non-bending areas NBA1 and NBA2 is illustrated in FIG. 1, embodiments are not limited thereto. That is, the present embodiment illustrates an example in which the flexible display device 1 includes the bending area BA and first and second non-bending areas NBA1 and NBA2, the bending area BA being interposed between the first non-bending area NBA1 and the second non-bending area NBA2. In other embodiments, the flexible display device 1 may include a plurality of bending areas BA. In some embodiments, the flexible display device 1 may include three or more non-bending areas.

In an embodiment, in the flexible display device 1, the bending area BA and the non-bending areas NBA1 and NBA2 may be arranged to be coupled to each other. For example, the non-bending areas NBA1 and NBA2 may be arranged on both sides of the bending area BA.

The display surface IS of the flexible display device 1 may include a plurality of areas. The display surface IS may include a display area DA in which an image is displayed and a non-display area NDA adjacent to the display area DA.

The display area DA may be defined by individual light-emitting elements, and may include a plurality of emission areas (not illustrated) that are areas which emit light in respective designated colors. Further, the display area DA may also be used as a detection member which detects an external environment.

The non-display area NDA is an area in which an image is not displayed. In an embodiment, the display area DA may have a rectangular shape. In an embodiment, the non-display area NDA may be disposed to surround the display area DA on the plane. Further, although not illustrated in the drawing, a speaker module, a camera module, a sensor module, etc. may or may not be arranged in the non-display area NDA. Here, the sensor module may include at least one of an illumination sensor, a proximity sensor, an infrared sensor, and an ultrasonic sensor.

However, the embodiments are not limited thereto, and the shapes of the display area DA and the non-display area NDA may be relatively varied.

A display direction of an image may be defined as the direction of a normal line of the display surface IS. In an embodiment, the display direction may be a same direction as the third direction DR3.

The flexible display device 1 is bendable. In an embodiment, the flexible display device 1 may be a foldable display device that may be folded. In some embodiments, the flexible display device 1 may be in-folded or out-folded.

In an embodiment, the bending axis BX may be an axis in the second direction DR2, but may be variously changed without being limited thereto. In an embodiment, in a state in which the flexible display device 1 is bent (or folded), a radius of curvature may be equal to or greater than 1 mm and less than or equal to 5 mm.

A flexible display device 1a illustrated in FIG. 2 indicates an in-folded state in which the display surface IS is inwardly positioned. When the flexible display device 1a is in-folded, the bending axis BX may be formed on the top of the display surface IS.

A flexible display device 1b illustrated in FIG. 3 indicates an out-folded state in which the display surface IS is outwardly positioned. When the flexible display device 1b is out-folded, the bending axis BX may be formed on the bottom of the display surface IS.

The flexible display device 1 may be configured to be in-folded or out-folded in one bending area BA, but embodiments thereof are not limited thereto. Herein, a description will be made based on the state in which the flexible display device 1 is in-folded in the bending area BA, and coupling relationships between respective components provided in the flexible display device 1 in the state in which the flexible display device 1 is unfolded will be described.

The flexible display device 1 may recognize an electronic pen 2. The electronic pen 2 may be an input means of the flexible display device 1.

When the electronic pen 2 approaches the flexible display device 1 within a certain distance (e.g., a predetermined distance) or touches a surface of the flexible display device 1, input information may be provided to a sensing film included in the flexible display device 1. Here, the input information may contain information about the position of the electronic pen 2 on the flexible display device 1, the touch strength of the electronic pen 2 (i.e., surface pressure on the flexible display device 1), or the like. That is, the sensing film may include a function of a conventional digitizer. In an embodiment, the electronic pen 2 may be a stylus pen. A further detailed description of the sensing film will be made later with reference to FIGS. 4A and 6.

The electronic pen 2 may be driven using any of various methods, such as electromagnetic resonance (EMR) and active electrostatic solution (AES).

The electromagnetic resonance (EMR) may include a scheme in which the electronic pen 2 produces electromagnetic resonance through a magnetic field generated in the flexible display device 1, and in which signals, such as the coordinates of the electronic pen 2, are then provided to the flexible display device 1. In further detail, when the sensing film or the like included in the flexible display device 1 generates a magnetic field, electromagnetic resonance is produced in the electronic pen 2 entering the range of the magnetic field, and, thus, energy depending on the electromagnetic resonance is supplied to the electronic pen 2. The electronic pen 2 supplied with energy may output a radio signal through an internal circuit. In this case, the sensing film may receive the signal, output from the electronic pen 2, at various points, measure the intensities of received signals, calculate a point closest to the electronic pen 2 based on the intensities, and then detect the position of the electronic pen 2.

The active electrostatic solution (AES) may include a scheme in which the electronic pen 2 causes static electricity and the sensing film recognizes the static electricity, thus sensing the coordinates, pressure, etc. of the electronic pen 2.

As the electronic pen 2, existing known electronic pens may be used.

Figure 4C:
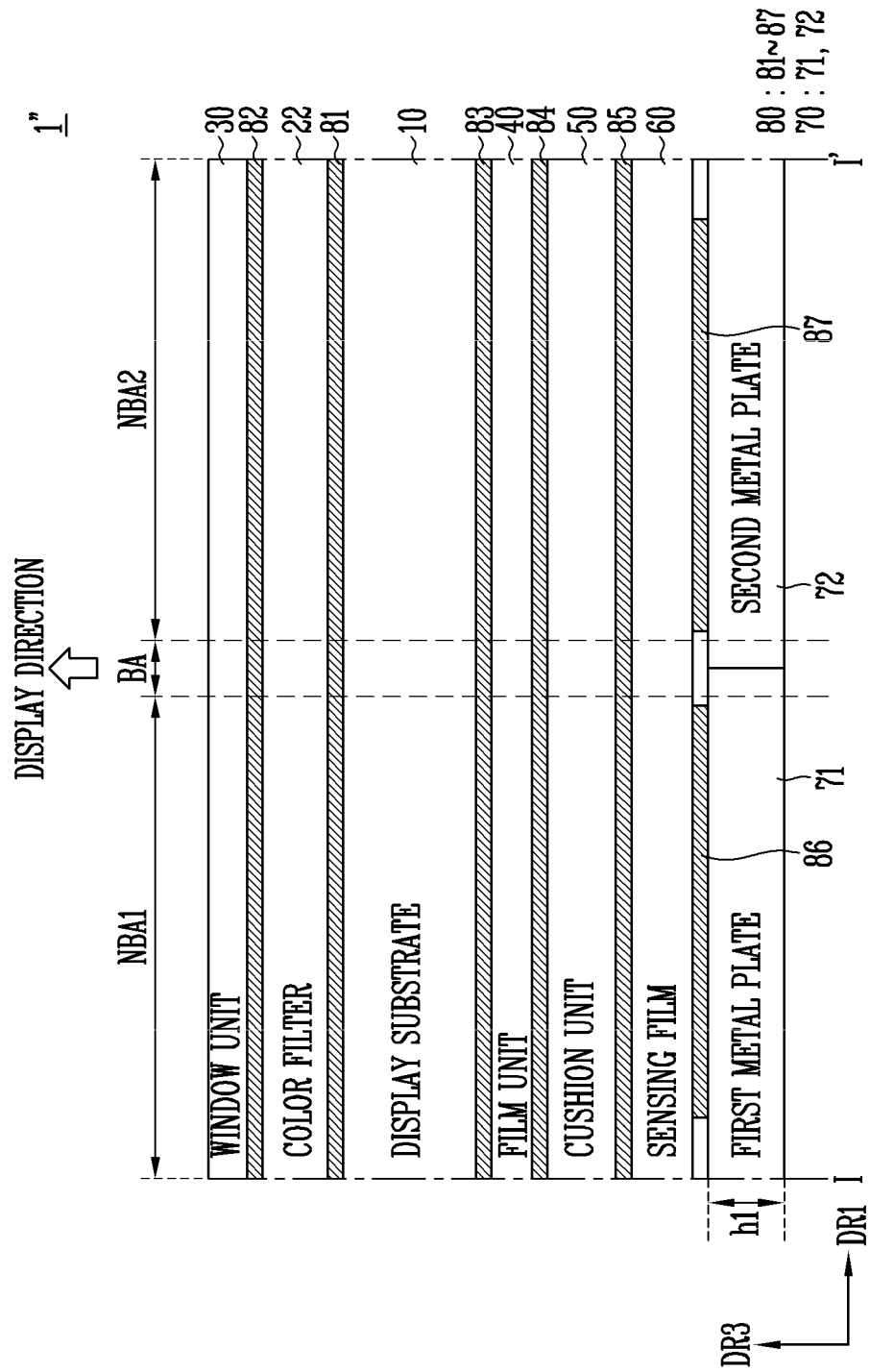
FIG. 4C is a cross-sectional view illustrating an application example of FIG. 4A.
Figure 5:
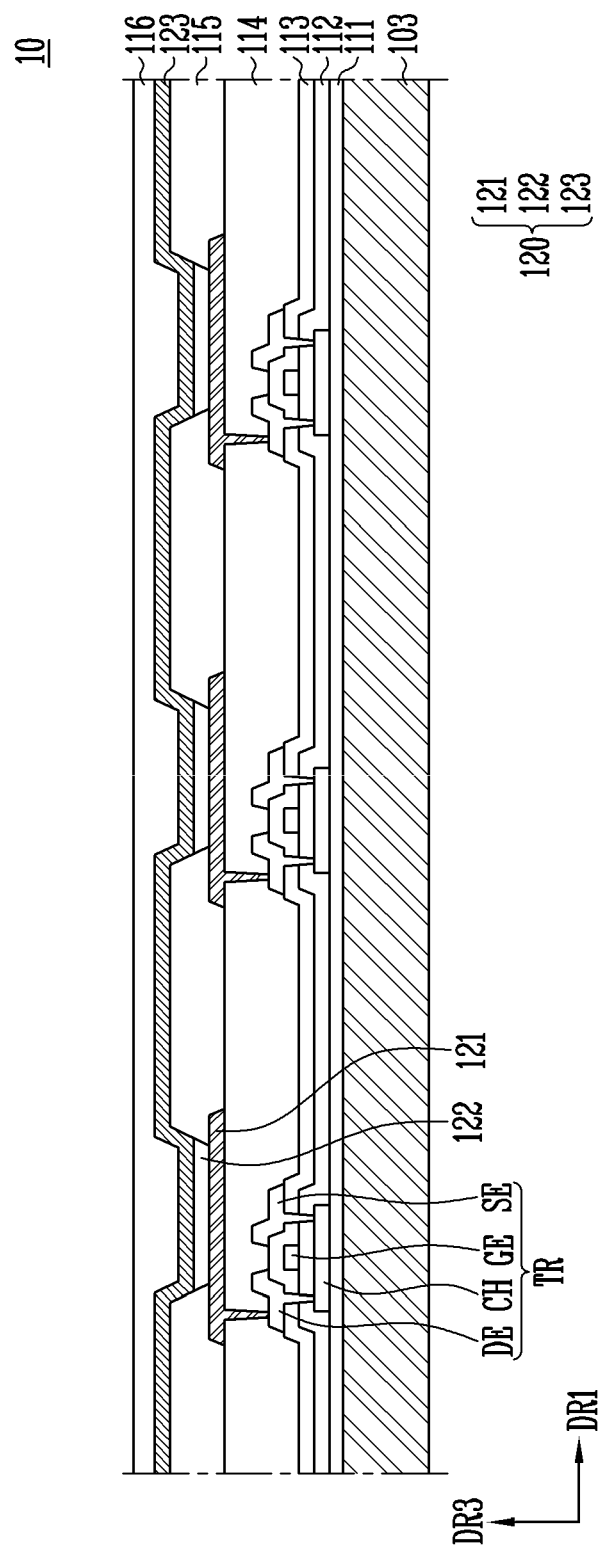
FIG. 5 is a cross-sectional view illustrating a display substrate of FIG. 4A.
Figure 6:
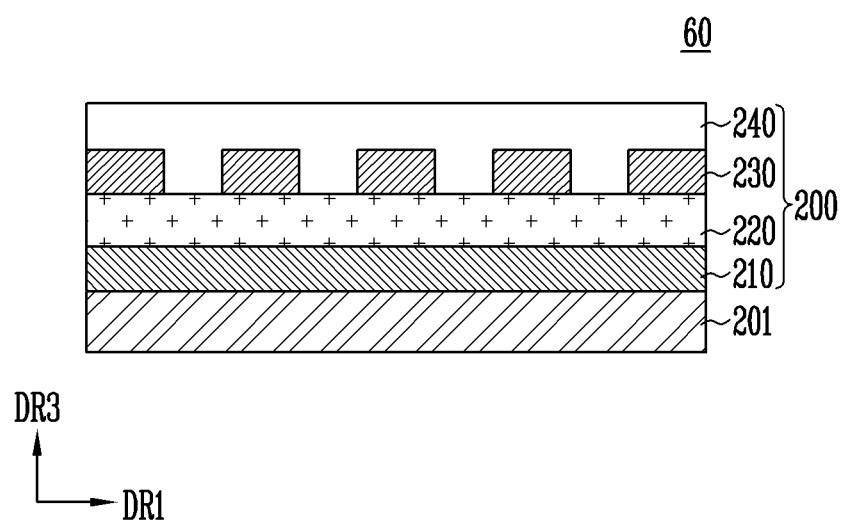
FIG. 6 is a cross-sectional view illustrating a sensing film of FIG. 4A.

FIG. 4A is a schematic cross-sectional view of a flexible display device according to an embodiment of the present disclosure; FIG. 4B is a cross-sectional view illustrating an application example of FIG. 4A; FIG. 4C is a cross-sectional view illustrating an application example of FIG. 4A; FIG. 5 is a cross-sectional view illustrating a display substrate of FIG. 4A; and FIG. 6 is a cross-sectional view illustrating a sensing film of FIG. 4A. Herein, for convenience of description, the thicknesses or the like of respective components of the flexible display device 1 may be slightly exaggerated as illustrated.

Referring to FIG. 4A, in an embodiment, the flexible display device 1 may include a display substrate 10, an anti-reflection member 20, a window unit 30, a film unit 40, a cushion unit 50, a sensing film 60, a plurality of metal plates 70, and a plurality of adhesive members 80. Although, in the present specification, respective components are described as being sequentially stacked along one direction, as illustrated in the drawings, it is apparent that the positions of respective components may be partially changed or that additional components may be further interposed between respective components.

Herein, the term "top" means a relative position in the same direction as a third direction D3, and the term "bottom" means a relative position in a direction opposite the third direction DR3. Further, herein, a corresponding component formed through a continuous process with another component is referred to as a "layer" or "film," and a component coupled to another component through an adhesive member is referred to as a "unit."

First, with reference to FIG. 4A together with FIG. 5, the display substrate 10 will be described.

A plurality of transistors TR and light-emitting elements 120 may be provided in the display substrate 10.

The display substrate 10 may include a base substrate 103 disposed in a lower portion of the display substrate 10. The base substrate 103 may be a flexible substrate. In an embodiment, for example, the base substrate 103 may be either a film substrate or a plastic substrate which includes a polymer organic material. For example, the base substrate 103 may include any of materials such as polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. In an embodiment, the base substrate 103 may include fiberglass reinforced plastic (FRP).

A buffer layer 111 may be disposed on the base substrate 103. The buffer layer 111 functions to smoothen the surface of the base substrate 103 and to prevent or substantially prevent moisture or external air from permeating into the base substrate 103. The buffer layer 111 may be an inorganic layer. The buffer layer 111 may have a single-layer structure or a multilayer structure.

A plurality of transistors TR may be disposed on the buffer layer 111. Here, the illustrated transistors TR may be driving transistors. One or more transistors TR may be provided in each pixel. Each transistor TR may include a semiconductor layer CH, a gate electrode GE, a source electrode SE, and a drain electrode DE.

The semiconductor layer CH may be disposed on the buffer layer 111. In an embodiment, the semiconductor layer CH may include any of amorphous silicon, polysilicon, and organic semiconductor. In other embodiments, the semiconductor layer CH may be an oxide semiconductor. Although not illustrated in the drawing, the semiconductor layer CH may include a channel region, and a source region and a drain region which are disposed on both sides of the channel region and are doped with impurities.

A gate insulating layer 112 may be disposed on the semiconductor layer CH. The gate insulating layer 112 may be an inorganic layer. The gate insulating layer 112 may have a single-layer structure or a multilayer structure.

The gate electrode GE may be disposed on the gate insulating layer 112. The gate electrode GE may be formed of a metal material having conductivity. For example, the gate electrode GE may include any of molybdenum (Mo), aluminum (Al), copper (Cu), titanium (Ti), etc. The gate electrode GE may have a single-layer structure or a multilayer structure.

An interlayer insulating layer 113 may be disposed on the gate electrode GE. The interlayer insulating layer 113 may be an inorganic layer. The interlayer insulating layer 113 may have a single-layer structure or a multilayer structure.

The source electrode SE and the drain electrode DE may be disposed on the interlayer insulating layer 113. Each of the source electrode SE and the drain electrode DE may be formed of a metal material having conductivity. For example, each of the source electrode SE and the drain electrode DE may include any of aluminum (Al), copper (Cu), titanium (Ti), and molybdenum (Mo).

The source electrode SE and the drain electrode DE may be respectively electrically coupled to the source region and the drain region of the semiconductor layer CH through contact holes penetrating the interlayer insulating layer 113 and the gate insulating layer 112.

Although not illustrated in the drawing, the display substrate 10 may further include a storage capacitor and a switch transistor on the base substrate 103.

A protective layer 114 may be disposed on the source electrode SE, the drain electrode DE, and the interlayer insulating layer 113. Here, the protective layer 114 may be disposed to cover a pixel circuit component including the transistors TR. The protective layer 114 may be a passivation layer or a planarization layer. The passivation layer may include SiO$_2$, SiNx, or the like, and the planarization layer may include a material such as acryl or polyimide. In an embodiment, the protective layer 114 may include both the passivation layer and the planarization layer. In this case, the passivation layer may be disposed on the source electrode SE, the drain electrode DE, and the interlayer insulating layer 113, and the planarization layer may be disposed on the passivation layer.

The top surface of the protective layer 114 may be planar. However, the top surface of the protective layer 114 is not limited thereto, and may not be planar. A further detailed description thereof will be provided later herein.

A plurality of first electrodes 121 may be disposed on the protective layer 114. Such a first electrode 121 may be a pixel electrode arranged in each pixel. In an embodiment, the first electrode 121 may be an anode electrode of an organic light-emitting diode.

The first electrode 121 may be electrically coupled to the drain electrode DE or the source electrode SE disposed on the base substrate 103 through a via hole penetrating the protective layer 114.

The first electrode 121 may be formed to include material having a high work function. The first electrode 121 may include an indium-tin oxide (ITO), an indium-zinc oxide (IZO), a zinc oxide (ZnO), an indium oxide (In$_2$O$_3$), etc. The above-described conductive materials have transparent characteristics while having a relatively high work function. In an embodiment, when the organic light-emitting display device is a top emission-type display device, the first electrode may further include a reflective material, such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a mixture thereof, in addition to the above-described conductive materials. Therefore, the first electrode 121 may have a single-layer structure composed of any of the above-described conductive material and reflective material, or a multilayer structure in which these layers are stacked.

A pixel-defining layer 115 may be disposed on the first electrode 121. The pixel-defining layer 115 may include an opening through which at least a part of the first electrode 121 is exposed. The pixel-defining layer 115 may include an organic material or an inorganic material. In an embodiment, the pixel-defining layer 115 may include any of materials such as photoresist, polyimide resin, acrylic resin, a silicon compound, and polyacrylic resin.

An organic light-emitting layer 122 may be disposed on the first electrode 121 exposed by the pixel-defining layer 115.

A second electrode 123 may be disposed on the organic light-emitting layer 122. In an embodiment, the second electrode 123 may be a common electrode disposed on the entire region without distinction of pixels. In an embodiment, the second electrode 123 may be a cathode electrode of the organic light-emitting diode.

The second electrode 123 may be formed to include a material having a low work function. In an embodiment, the second electrode 123 may include Li, Ca, LiF/Ca, LiF/Al, Al, Mg, Ag, Pt, Pd, Ni, Au Nd, Ir, Cr, BaF, Ba or a compound or mixture thereof (e.g., a mixture of Ag and Mg, etc.). In an embodiment, the second electrode 123 may further include an auxiliary electrode. The auxiliary electrode may include a layer, which is formed by depositing the corresponding material, and a transparent metal oxide, e.g., an indium-tin oxide (ITO), an indium-zinc oxide (IZO), a zinc oxide (ZnO), or an indium-tin-zinc oxide, which is formed on the layer.

In an embodiment, when the display substrate 10 is a top emission-type display substrate, a conductive layer having a low work function may be formed as the second electrode 123 in the shape of a thin film, and a transparent conductive layer, e.g., an indium-tin oxide (ITO) layer, an indium-zinc oxide (IZO) layer, a zinc oxide (ZnO) layer, or an indium oxide (In$_2$O$_3$) layer, may be stacked on the second electrode 123.

The above-described first electrode 121, organic light-emitting layer 122, and second electrode 123 may form an organic light-emitting diode 120 as a light-emitting element.

In an embodiment, although not illustrated in the drawing, a hole injection layer and/or a hole transport layer may be interposed between the first electrode 121 and the organic light-emitting layer 122, and an electron transport layer and/or an electron injection layer may be interposed between the organic light-emitting layer 122 and the second electrode 123.

An encapsulation layer 116 may be disposed on the second electrode 123. The encapsulation layer 116 includes an inorganic layer. In an embodiment, the encapsulation layer 116 may include a plurality of stacked layers. Although not illustrated in the drawings, the encapsulation layer 116 may be implemented as a multilayer structure including a first inorganic layer, an organic layer, and a second inorganic layer that are sequentially stacked. In an embodiment, each of the first inorganic layer and the second inorganic layer may include one or more selected from the group consisting of a silicon oxide (SiOx), a silicon nitride (SiNx), and silicon oxynitride (SiONx), and the organic layer may include any one selected from the group consisting of epoxy, acrylate, and urethane acrylate.

The anti-reflection member 20 may be disposed on the display substrate 10. Referring to FIGS. 4B and 4C, illustrating flexible display devices 1' and 1", together with FIG. 4A, the anti-reflection member 20 may include a polarizing member 23 and/or a color filter 22.

Here, the polarizing member 23 may transmit light parallel to a polarization axis in one direction, out of light emitted from the organic light-emitting diode 120. The polarizing member 23 may be a coating-type polarizing layer or a polarizing layer formed via deposition. The polarizing member 23 may be formed by coating with a material containing a dichroic dye and a liquid crystal compound. Further, the polarizing member 23 functions to prevent or substantially prevent the reflection of external light. In an embodiment, the polarizing member 23 may include a quarter-wave plate.

In an embodiment, the color filter 22 may be any of color filters corresponding to red, green, and blue. The red color filter selectively transmits red light. Here, the wavelength of the red light may range from 620 nm to 750 nm. The green color filter selectively transmits green light. Here, the wavelength of green light may range from 495 nm to 570 nm. The blue color filter selectively transmits blue light. Here, the wavelength of blue light may range from 450 nm to 495 nm.

In an embodiment, the red color filter may be arranged in a red pixel, the green color filter may be arranged in a green pixel, and the blue color filter may be arranged in a blue pixel. Since the color filters of the same color are arranged in the pixel of the color, color mixing at the corresponding pixel may be prevented or substantially prevented, and color reproducibility at the corresponding pixel may be improved. Also, since the color filters absorb external light at a considerably high level, the reflection of external light may be reduced even if the polarizing member 23 or the like is not additionally provided.

The window unit 30 may be disposed on the anti-reflection member 20. The window unit 30 functions to protect the display substrate 10 by covering the display substrate 10. The window unit 30 may include a flexible material and a transparent material. For example, the window unit 30 may be made of a material including plastic, and the window unit 30 in that case may have flexible properties.

Examples of plastic applicable to the window unit 30 may include, but are not limited to, polyimide, polyacrylate, polymethylmethacrylate (PMMA), polycarbonate (PC), polyethylene naphthalate (PEN), polyvinylidene chloride, polyvinylidene difluoride (PVDF), polystyrene, ethylene vinylalcohol copolymer, polyethersulfone (PES), polyetherimide (PEI), polyphenylene sulfide (PPS), polyallylate, triacetyl cellulose (TAC), and cellulose acetate propionate (CAP). The window unit 30 may be formed to include one or more of the listed plastic materials.

The film unit 40 may be disposed below the display substrate 10. In an embodiment, the film unit 40 may be a protective film. In an embodiment, the film unit 40 may be disposed to cover the entirety of a bottom surface of the display substrate 10.

The film unit 40 may be made of, but is not limited to, a plastic material such as polyethylene terephthalate (PET), polyethylene naphthalate (PEN), polyimide (PI), or polyethylene sulfide (PES).

The cushion unit 50 may be disposed below the film unit 40. The cushion unit 50 may be formed of any of various materials providing a cushioning function. For example, the cushion unit 50 may be formed of latex, sponge, urethane foam that is foam resin, EVA, or silicone. In an embodiment, the cushion unit 50 may be formed in the form of a tape having a cushion.

The sensing film 60 may be disposed below the cushion unit 50. In an embodiment, the sensing film 60 may be disposed to overlap the entirety of the bottom surface of the display substrate 10. In the present specification, the expression "a first component and a second component overlap each other" may mean that the first element and the second element overlap each other in a thickness direction (i.e., the third direction DR3) in a state in which the flexible display device 1 is unfolded. In an embodiment, the sensing film 60 may be disposed to overlap all of the bending area BA and the plurality of non-bending areas NBA1 and NBA2.

A further detailed description of the sensing film 60 will be provided below with reference to FIG. 6.

In an embodiment, the sensing film 60 includes a base film 201 and a digitizer module 200 disposed on the base film 201. The digitizer module 200 may include a first sensing electrode 210, an insulating layer 220, a second sensing electrode 230, and a passivation layer 240 which are sequentially stacked on the base film 201.

In an embodiment, the first and second sensing electrodes 210 and 230 may be used as receiver-type electrodes. One of the first and second sensing electrodes 210 and 230 may extend in a first direction, and the other may extend in a direction intersecting the first direction.

Each of the first and second sensing electrodes 210 and 230 may contain a conductive material, and, in an embodiment, a metal material. For example, gold (Au), silver (Ag), copper (Cu), molybdenum (Mo), nickel (Ni), chromium (Cr), a silver-palladium-copper (APC) alloy, or the like may be used as the metal material, but the metal material is not limited to such examples.

In an embodiment, each of the first and second sensing electrodes 210 and 230 may have a thickness of 2000 Å to 10 μm. When the thickness of each of the first and second sensing electrodes 210 and 230 is less than 2000 Å, surface resistance may increase, and then electrical characteristics of the sensing electrodes may be deteriorated, whereas when the thickness is greater than 10 μm, the flexibility resistance of the sensing electrodes may be deteriorated.

In an embodiment, each of the first and second sensing electrodes 210 and 230 may have a thickness of about 3000 Å to 8000 Å. When the thickness of each of the first and second sensing electrodes 210 and 230 is in a range from 3000 Å to 8000 Å, flexibility resistance may be secured to such an extent as to enable not only bending but also folding, and thus the first and second sensing electrodes may be more suitable for the flexible display device 1.

The thicknesses of the first and sensing electrodes 210 and 230 may be the same or different from each other.

In an embodiment, the first and sensing electrodes 210 and 230 may be formed by deposition, and, in an embodiment, sputtering. When sputtering is used, the first and second sensing electrodes 210 and 230 may be formed with a thickness smaller than that in a case in which sensing electrodes are formed using a metal foil, as in the case of sensing films that are currently commercialized.

The insulating layer 220 may be formed of an organic insulating layer or an inorganic insulating layer.

As the material of the passivation layer 240, an insulating material known to the corresponding technical field may be used without limitations. Also, as the material of the passivation layer 240, a non-metal oxide, such as a silicon oxide, or a photosensitive resin composition or a thermoplastic resin composition, which contains acrylic resin, may be used.

In an embodiment, the passivation layer 240 may be formed of, for example, a polycycloolefin-based material, and may have a thickness of about 0.5 μm to 20 μm.

In another embodiment, the passivation layer 240 may be formed of, for example, an acrylic organic insulating layer, and may have a thickness of about 0.5 μm to 5 μm.

As the base film 201, a flexible film material may be used, and a film having excellent mechanical strength and thermal stability may be used. Examples of the base film 201 may include films made of thermoplastic resin including, for example, polyester resin, such as polyethylene terephthalate, polyethylene isophthalate, polyethylene naphthalate, or polybutylene terephthalate; cellulose resin, such as diacetyl cellulose or triacetyl cellulose; polycarbonate resin; acryl resin, such as polymethyl (meth)acrylate or polyethyl (meth) acrylate; styrene resin, such as polystyrene or acrylonitrile-styrene copolymer; polyolefin resin, such as polyethylene, polypropylene, cyclic polyolefin or polyolefin having a norbornene structure, or ethylene-propylene copolymer; vinyl chloride resin; amide resin, such as nylon or aromatic polyimide; imide resin; polyethersulfone resin; sulfone resin; polyether ether ketone resin; polyphenylene sulfide resin; vinylalcohol resin; vinylidene chloride resin; vinylbutyral resin; allylate resin; polyoxymethylene resin; and epoxy resin. Further, a film formed of a blend of the thermoplastic resin described above may also be used. Further, a film formed of thermosetting resin based on (meth)acrylate, urethane, acrylic urethane, epoxy or silicon or formed of UV-curing resin may be used.

In some embodiments, the base film 201 may be omitted.

A plurality of metal plates 70 may be disposed below the sensing film 60. At a position overlapping the first non-bending area NBA1, a first metal plate 71 may be arranged, and at a position overlapping the second non-bending area NBA2, a second metal plate 72 may be arranged.

In an embodiment, respective facing ends of the first metal plate 71 and the second metal plate 72, in a state in which the flexible display device 1 is unfolded, may overlap the bending area BA. In an embodiment, the facing ends of the first metal plate 71 and the second metal plate 72, in the state in which the flexible display device 1 is unfolded, may come into contact with each other, but the present disclosure is not limited thereto.

The first metal plate 71 and the second metal plate 72 may be separated from each other without being respectively bent in a state in which the flexible display device 1 is bent. That is, respective ends of the first metal plate 71 and the second metal plate 72, which face each other, may not come into contact with each other in a state in which the flexible display device 1 is bent.

Below, the plurality of metal plates 70 will be described based on the first metal plate 71. Since the first metal plate 71 and the second metal plate 72 may be configured in substantially the same manner, a description of the first metal plate 71 may be applied to the second metal plate 72. Therefore, a repeated description of the second metal plate 72 will be omitted.

The first metal plate 71 may have an electromagnetic shielding function. The first metal plate 71 may minimize or reduce the influence of electric or magnetic noise occurring below the first metal plate 71 on the sensing electrodes and the display substrate 10 disposed on the first metal plate 71.

In addition, the first metal plate 71 may further perform at least one of a thermal function, a ground function, a buffer function, a strength-supplementation function, a support function, an adhering function, and a pressure sensing function.

In an embodiment, the first metal plate 71 may be formed of a soft magnetic material, and may be a thin metal sheet having an amorphous structure or a nanocrystalline structure. Here, the soft magnetic material denotes a magnetic material that is strongly magnetized even if an external magnetic field is only slightly applied thereto and that has low current magnetization. The soft magnetic material is differentiated from a hard magnetic material (or a ferromagnetic material) in which magnetic moment is aligned in one direction without an external magnetic field.

The soft magnetic material may be magnetized at a low magnetic field (e.g., below 800 A/m). In an embodiment, the soft magnetic material may have high magnetic permeability (e.g., an initial value in a range from 102 μ to 105 μ and a maximum value in a range from 103 μ to 106μ). In an embodiment, the coercive force of the soft magnetic material may be in a range from 0.8 A/m to 8 A/m.

The capability of the soft magnetic field to be magnetized at a low magnetic field may occur in some materials having low strength of magnetic anisotropic energy. For example, the soft magnetic material may contain Invar (such as Fe—Co—Cr alloy, Fe—Ni alloy, or Fe—Ni—Co alloy), ferritic stainless steel (such as SUS430 (Fe—Cr alloy) or the like), Permalloy (Fe—Ni alloy), Perminvar or Permendur.

In an embodiment, a thickness h1 of the first metal plate 71 may be in a range from about 20 μm to 150 μm.

The above-described display substrate 10, anti-reflection member 20, window unit 30, film unit 40, cushion unit 50, sensing film 60, and metal plates 70 may be attached to each other, with adhesive members 80 being respectively interposed therebetween.

For example, the display substrate 10 and the anti-reflection member 20 may be attached to each other through a first adhesive member 81, the anti-reflection member 20 and the window unit 30 may be attached to each other through a second adhesive member 82, the display substrate 10 and the film unit 40 may be attached to each other through a third adhesive member 83, the film unit 40 and the cushion unit 50 may be attached to each other through a fourth adhesive member 84, and the cushion unit 50 and the sensing film 60 may be attached to each other through a fifth adhesive member 85. The sensing film 60 and the first metal plate 71 may be attached to each other through a sixth adhesive member 86, and the sensing film 60 and the second metal plate 72 may be attached to each other through a seventh adhesive member 87.

The plurality of adhesive members 80 may include a film having adhesive property, for example, an optically clear adhesive (OCA). In an embodiment, the adhesive members 80 may include optically clear resin (OCR).

In some embodiments, one or more of the adhesive members 80 may be omitted.

In an embodiment, when the flexible display device 1 is bent or unfolded, the strength of repulsive force may be in a range from about 14N*cm to 20 N*cm at room temperature. Although the flexible display device 1 according to the present embodiment is provided with the plurality of metal plates 70, an increase in repulsive force may be minimized or reduced compared to a case in which the strength of repulsive force of a conventional flexible display device to which a sensing film is not applied is about 14 N*cm at room temperature. Since the first metal plate 71 and the second metal plate 72 are respectively disposed in the first non-bending area NBA1 and the second non-bending area NBA2, the first metal plate 71 and the second metal plate 72 may not be bent even if the flexible display device 1 is bent or folded.

In this way, since the flexible display device 1 is provided with the sensing film 60 including the digitizer module 200, repulsive force may be minimized or reduced when the flexible display device 1 is bent, or folded, or unfolded while the input of the electronic pen 2 is recognized.

Below, a flexible display device according to some other embodiments will be described. Herein, repeated descriptions of the same components as those in FIGS. 1 to 6 are omitted, and same or similar reference numerals are used to designate the same or similar components.

Figure 7:
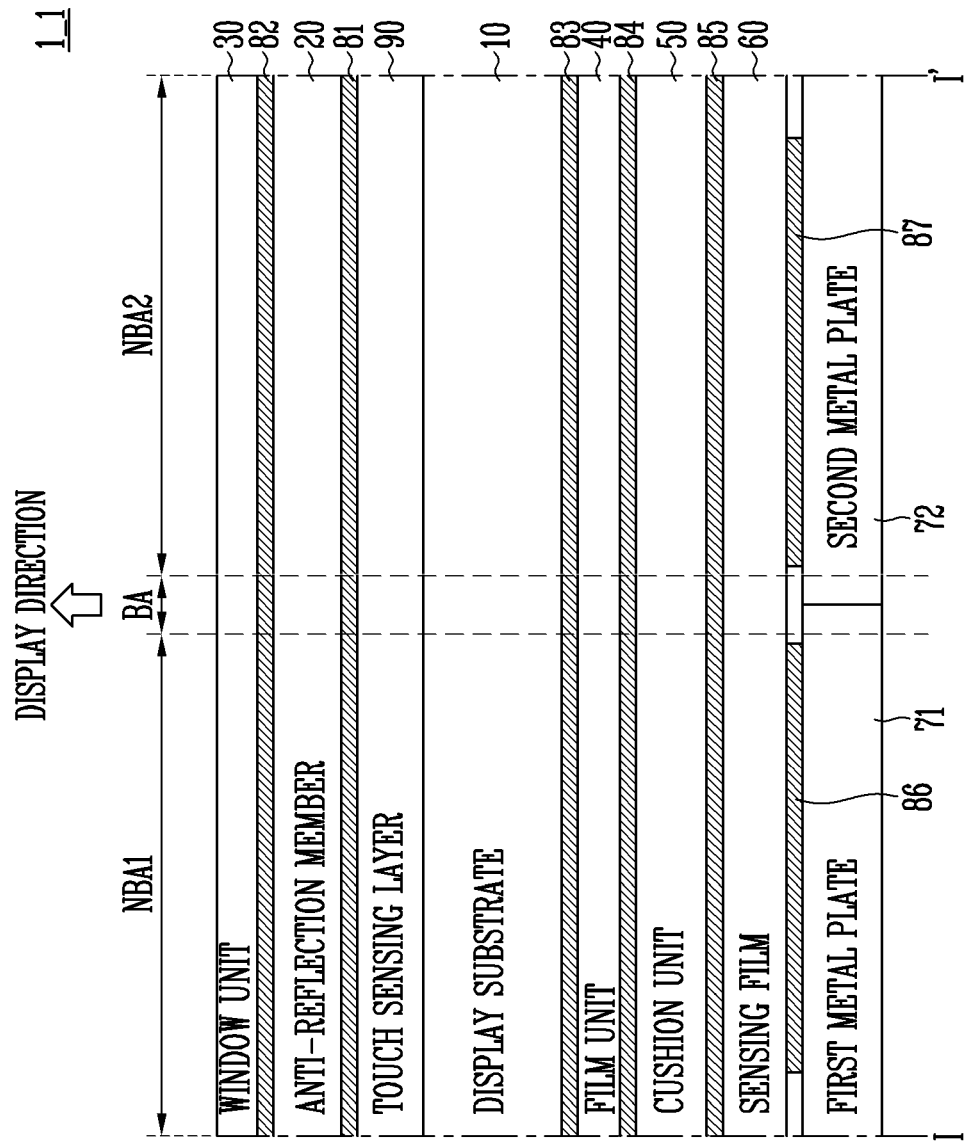
FIG. 7 is a schematic cross-sectional view of a flexible display device according to an embodiment of the present disclosure.
Figure 8:
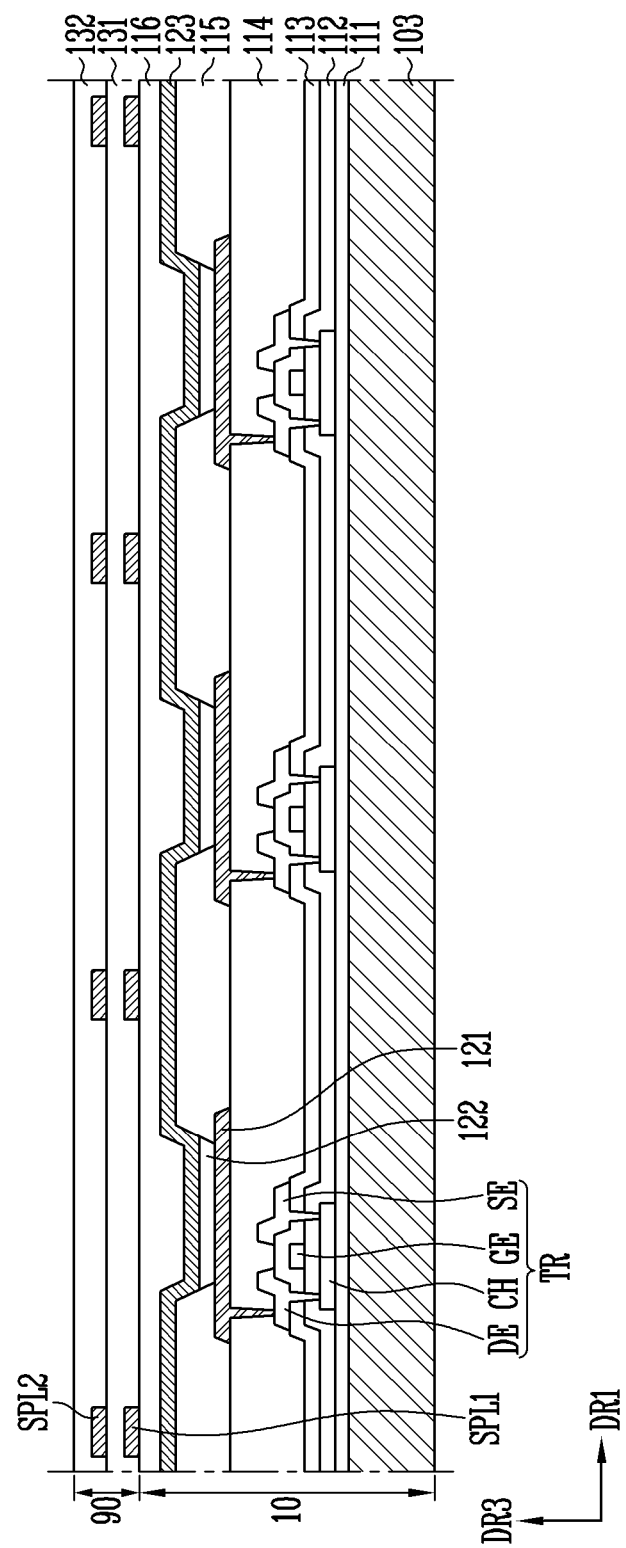
FIG. 8 is a cross-sectional view illustrating a display substrate and a touch sensing layer of FIG. 7.

FIG. 7 is a schematic cross-sectional view of a flexible display device according to an embodiment of the present disclosure; and FIG. 8 is a cross-sectional view illustrating a display substrate and a touch sensing layer of FIG. 7.

Referring to FIGS. 7 and 8, a flexible display device 1_1 according to an embodiment is different from the flexible display device 1 according to the embodiment illustrated in FIGS. 4A and 5 in that a touch sensing layer 90 is further disposed on the display substrate 10.

The touch sensing layer 90 may be disposed on the display substrate 10. In an embodiment, the touch sensing layer 90 may be formed using an on-cell touch AMOLED (OCTA) scheme in which a touch panel is embedded in a display panel.

The touch sensing layer 90 may be disposed on the encapsulation layer 116 of the display substrate 10. In accordance with an embodiment, the encapsulation layer 116 and the touch sensing layer 90 may be in direct contact with each other.

The touch sensing layer 90 may include a plurality of first sensing electrodes (not illustrated) and a plurality of second sensing electrodes (not illustrated). Although not illustrated in the drawing, the plurality of first sensing electrodes and the plurality of second sensing electrodes may intersect each other in a plane. In an embodiment, the plurality of first sensing electrodes and the plurality of second sensing electrodes may respectively include first sensing lines SPL1 and second sensing lines SPL2, each of which has a planar mesh shape.

The plurality of first sensing lines SPL1 may be electrically isolated from the plurality of second sensing lines SPL2. The plurality of first sensing lines SPL1 and the plurality of second sensing lines SPL2 may be disposed on the same layer or on different layers. FIG. 8 illustrates an example in which the first sensing lines SPL1 and the second sensing lines SPL2 are disposed on different layers.

The plurality of first sensing lines SPL1 and the plurality of second sensing lines SPL2 may include a conductive material. Here, the conductive material may include, for example, a low-resistance material, such as silver (Ag), aluminum (Al), chromium (Cr), or nickel (Ni), and a conductive nanomaterial, such as silver nanowire or carbon nanotube.

In an embodiment, the first sensing lines SPL1 may be disposed directly on the encapsulation layer 116. However, embodiments are not limited thereto, and an insulating layer having a single-layer structure or a multilayer structure may be interposed between the encapsulation layer 116 and the first sensing lines SPL1.

A first touch insulating layer 131 may be disposed on the first sensing lines SPL1 and the encapsulation layer 116.

The first touch insulating layer 131 may include, for example, an inorganic material. Here, the inorganic material may include one or more selected from the group consisting of a silicon oxide (SiOx), a silicon nitride (SiNx), and a silicon oxynitride (SiONx). In an embodiment, the first touch insulating layer 131 may include an organic material. Here, the organic material may include at least one of acrylic resin, metacrylic resin, polyisoprene, polyvinyl resin, epoxy resin, urethane resin, cellulose resin, siloxane resin, polyimide resin, polyamide resin, and perylene resin.

The second sensing lines SPL2 may be disposed on the first touch insulating layer 131. The first sensing lines SPL1 and the second sensing lines SPL2 may overlap the pixel-defining layer 115. That is, as the first sensing lines SPL1 and the second sensing lines SPL2 completely overlap the pixel-defining layer 115, the first and second sensing lines may be prevented or substantially prevented from being perceived by a user.

A second touch insulating layer 132 may be disposed on the first touch insulating layer 131 and the second sensing lines SPL2. The second touch insulating layer 132 may include, for example, an inorganic material or an organic material. Since the types of inorganic material and organic material may be the same as those of the first touch insulating layer 131, a further detailed description thereof will be omitted. Although, in FIG. 8, the first touch insulating layer 131 and the second touch insulating layer 132 are illustrated as having a single-layer structure, they may also have a multilayer structure.

Here, the second touch insulating layer 132 may be a passivation layer or a planarization layer.

Figure 9:
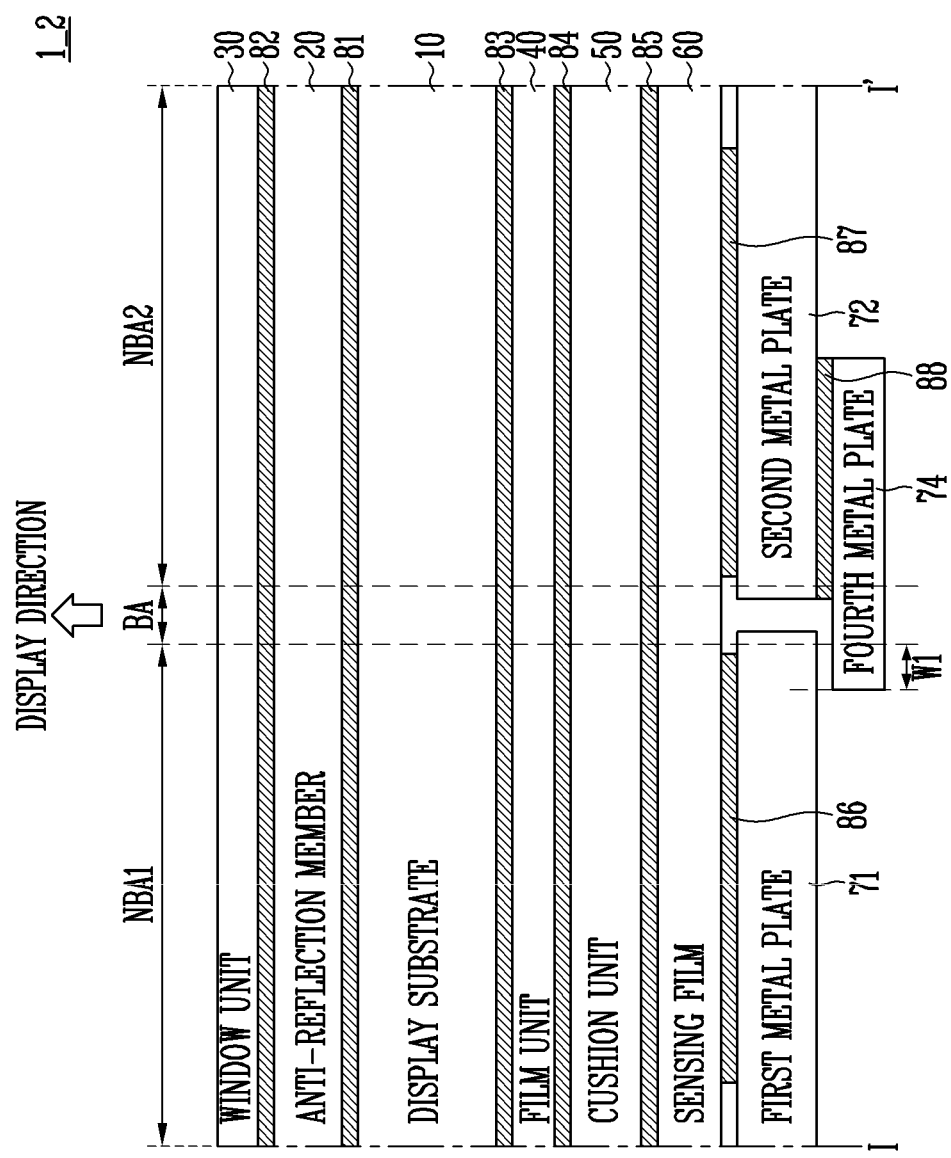
FIG. 9 is a schematic cross-sectional view of a flexible display device according to an embodiment of the present disclosure.

FIG. 9 is a schematic cross-sectional view of a flexible display device according to an embodiment of the present disclosure.

Referring to FIG. 9, a flexible display device 1_2 according to an embodiment is different from the flexible display device 1 according to the embodiment shown in FIG. 4A in that a fourth metal plate 74 disposed below the second metal plate 72 is further included.

The fourth metal plate 74 may be attached to a bottom of the second metal plate 72 through an eighth adhesive member 88.

In an embodiment, respective facing ends of the first metal plate 71 and the second metal plate 72 may be spaced apart from each other by an interval (e.g., a predetermined interval). Here, in order to reduce the influence of noise, occurring below the first metal plate 71 and the second metal plate 72, on sensing electrodes and the display substrate 10 through a separation space between the first metal plate 71 and the second metal plate 72, the fourth metal plate 74 may be disposed below the second metal plate 72.

The fourth metal plate 74 may be disposed to cover the separation space. In an embodiment, an end of the fourth metal plate 74 attached to the bottom of the second metal plate 72 may extend to overlap at least a portion of the first metal plate 71. That is, the fourth metal plate 74 may overlap the first metal plate 71 by a width (e.g., a predetermined width) W1.

Similar to the first metal plate 71, the fourth metal plate 74 may be formed of a soft magnetic material, and may include a material described above with respect to the first metal plate 71.

Figure 10:
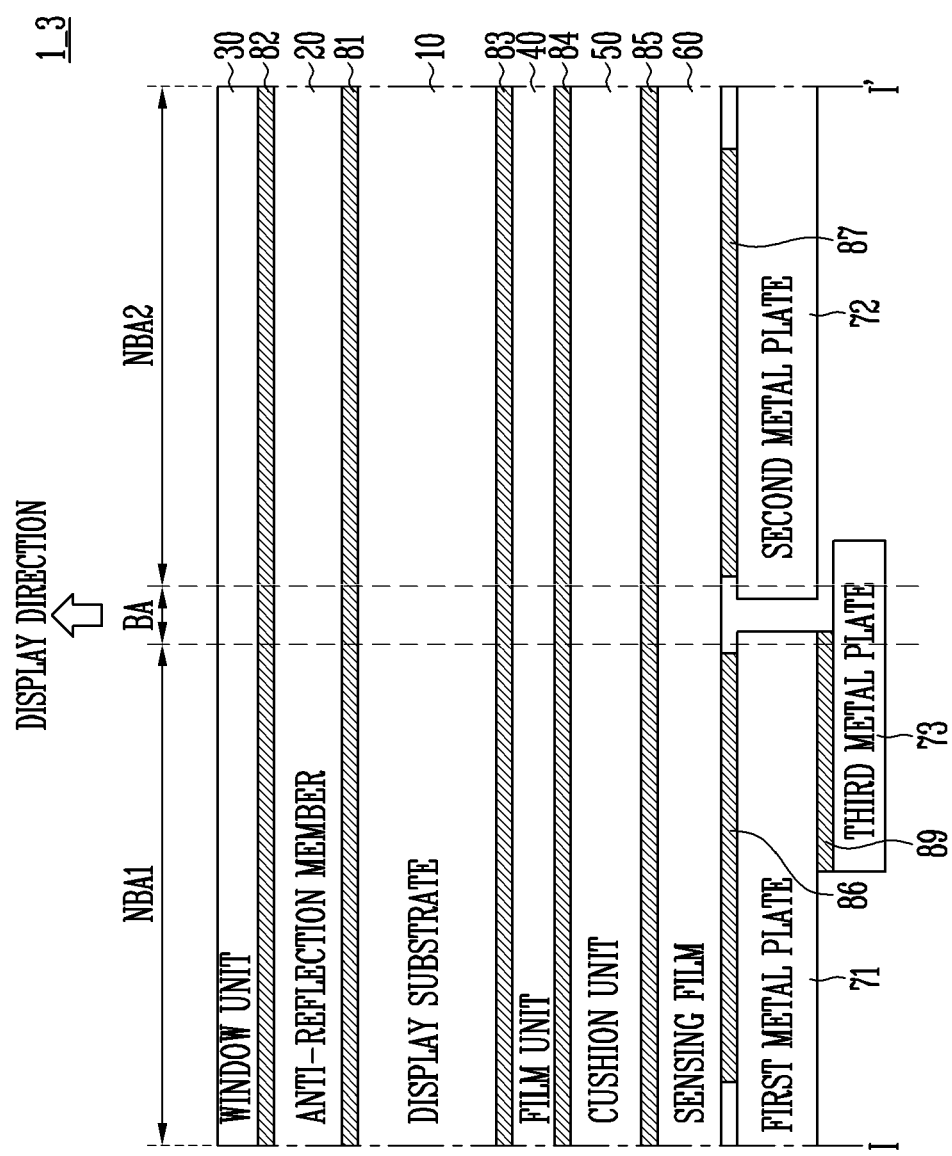
FIG. 10 is a schematic cross-sectional view of a flexible display device according to an embodiment of the present disclosure.

FIG. 10 is a schematic cross-sectional view of a flexible display device according to an embodiment of the present disclosure.

Referring to FIG. 10, a flexible display device 1_3 according to an embodiment is different from the flexible display device 1 according to the embodiment shown in FIG. 4A in that a third metal plate 73 disposed below the first metal plate 71 is further included.

The third metal plate 73 may be attached to the bottom of the first metal plate 71 through a ninth adhesive member 89.

Since a description of the present embodiment may be applied in substantially the same way as the configuration in which the fourth metal plate 74 according to the embodiment shown in FIG. 9 is disposed below the second metal plate 72, a repeated description thereof will be omitted.

Figure 11:
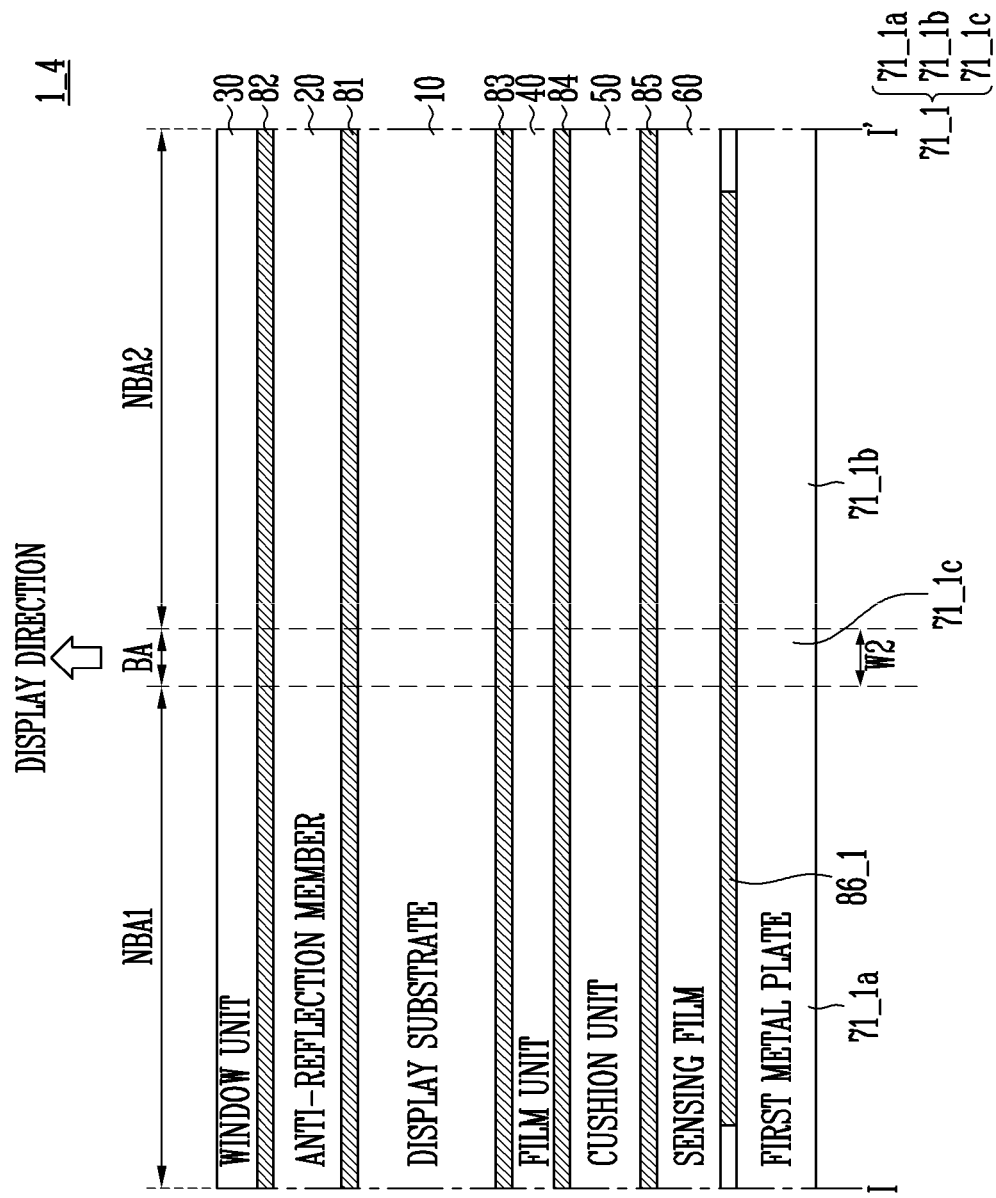
FIG. 11 is a schematic cross-sectional view of a flexible display device according to an embodiment of the present disclosure.
Figure 12:
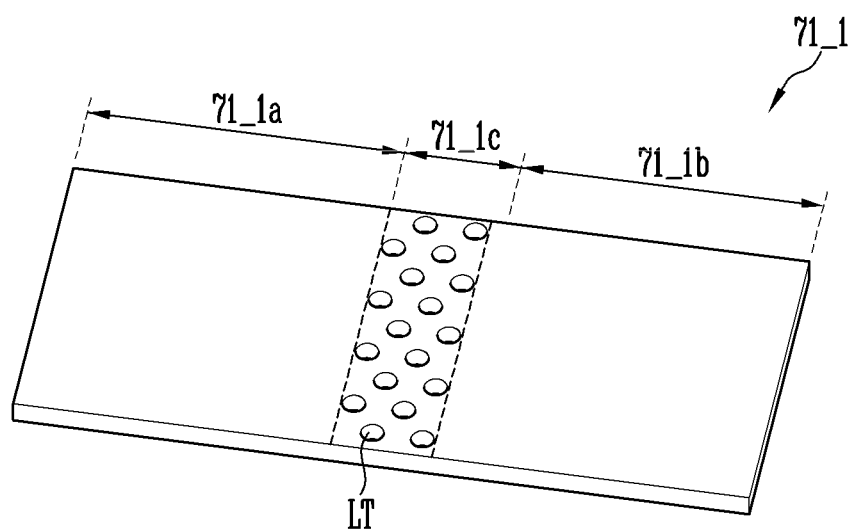
FIG. 12 is a schematic perspective view of a sensing film of FIG. 11 to explain the plane of the sensing film.

FIG. 11 is a schematic cross-sectional view of a flexible display device according to an embodiment of the present disclosure; and FIG. 12 is a schematic perspective view of a first sensing film of FIG. 11 to explain the plane of the first sensing film.

Referring to FIGS. 11 and 12, a flexible display device 1_4 according to an embodiment is different from the flexible display device 1 according to the embodiment shown in FIGS. 4A and 5 in that a first metal plate 71_1 is disposed to overlap all of the first non-bending area NBA1, the second non-bending area NBA2, and the bending area BA under the display substrate 10 and in that the second metal plate 72 is omitted. The sensing film 60 and the first metal plate 71_1 may be attached to each other through a sixth adhesive member 86_1.

The first metal plate 71_1 may include a lattice pattern LT on a surface thereof. In an embodiment, the lattice pattern LT may be formed on the surface of the first metal plate 71_1 in the form of a groove, or formed to penetrate the first metal plate 71_1 in the form of a hole.

The first metal plate 71_1 may include a lattice area 71_1c, defined as an area in which the lattice pattern LT is formed, and flat areas 71_1a and 71_1b, defined as areas in which the lattice pattern LT is not formed. The flat areas 71_1a and 71_1b may be positioned, with the lattice area 71_1c being interposed therebetween.

In an embodiment, the lattice area 71_1c may overlap the bending area BA. That is, the lattice pattern LT may be formed to overlap the bending area BA. A width W2 of the lattice area 71_1c may vary with a radius of curvature obtained when the flexible display device 1_4 is bent. In an embodiment, the width W2 of the lattice area 71_1c may be in a range from 2 mm to 20 mm.

Since the first metal plate 71_1 may include the lattice pattern LT on the surface thereof, it may be easily bent.

Figure 13:
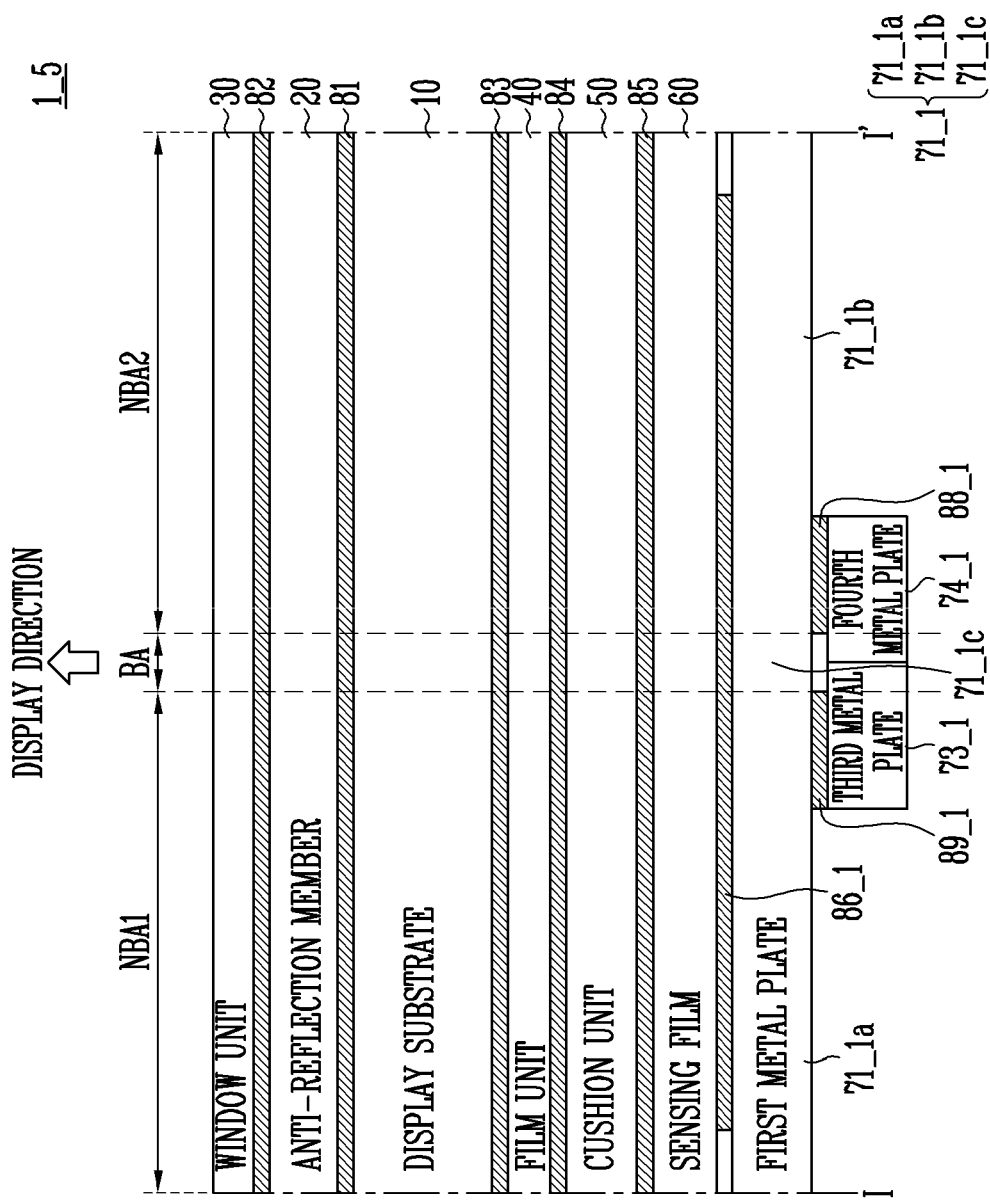
FIG. 13 is a schematic cross-sectional view of a flexible display device according to an embodiment of the present disclosure.

FIG. 13 is a schematic cross-sectional view of a flexible display device according to an embodiment of the present disclosure.

Referring to FIG. 13, a flexible display device 1_5 according to an embodiment is different from the flexible display device 1_4 according to the embodiment shown in FIG. 11 in that a third metal plate 73_1 and a fourth metal plate 74_1 disposed below the first metal plate 71_1 are further included.

The fourth metal plate 74_1 may be attached to the bottom of the first metal plate 71_1 through an eighth adhesive member 88_1 so as to overlap the second non-bending area NBA2, and the third metal plate 73_1 may be attached to the bottom of the first metal plate 71_1 through a ninth adhesive member 89_1 so as to overlap the first non-bending area NBA1.

The third metal plate 73_1 and the fourth metal plate 74_1 may extend such that respective ends thereof overlap the bending area BA. Respective ends of the fourth metal plate 74_1 and the third metal plate 73_1 may overlap the lattice area 71_1c of the first metal plate 71_1.

In an embodiment, respective facing ends of the third metal plate 73_1 and the fourth metal plate 74_1, in a state in which the flexible display device 1_5 is unfolded, may overlap the bending area BA. In an embodiment, the facing ends of the third metal plate 73_1 and the fourth metal plate 74_1, in the state in which the flexible display device 1_5 is unfolded, may come into contact with each other, but the present disclosure is not limited thereto.

FIG. 14 is a schematic cross-sectional view of a flexible display device according to an embodiment of the present disclosure.

Referring to FIG. 14, a flexible display device 1_6 according to an embodiment is different from the flexible display device 1_4 according to the embodiment shown in FIG. 11 in that a fourth metal plate 74_2 disposed below the first metal plate 71_1 is further included.

The fourth metal plate 74_2 may be attached to the bottom of the first metal plate 71_1 through the eighth adhesive member 88_1 so as to overlap the second non-bending area NBA2. The eighth adhesive member 88_1 may overlap the second non-bending area NBA2. The fourth metal plate 74_2 may be disposed to cover the lattice area 71_1c of the first metal plate 71_1. That is, the fourth metal plate 74_2 may extend such that an end thereof overlaps the bending area BA, and may further extend such that the end thereof overlaps at least a part of the first non-bending area NBA1.

FIG. 15 is a schematic cross-sectional view of a flexible display device according to an embodiment of the present disclosure.

Referring to FIG. 15, a flexible display device 1_7 according to an embodiment is different from the flexible display device 1_1 according to the embodiment shown in FIG. 7 in that the anti-reflection member 20 and the first adhesive member 81 are omitted and in that a wavelength conversion pattern 21 and a color filter 22 are further disposed directly on the touch sensing layer 90.

The wavelength conversion pattern 21 may convert a peak wavelength of incident light into another specific peak wavelength and emit the wavelength-converted light. The light passing through the wavelength conversion pattern 21 may indicate any one of three primary colors, such as red, green, and blue. However, colors indicated by the wavelength conversion pattern 21 are not limited to three primary colors, and the wavelength conversion pattern 21 may indicate any one of cyan, magenta, yellow, and white colors.

The wavelength conversion pattern 21 may include a wavelength conversion material. The wavelength conversion material may convert the peak wavelength of incident light into another specific peak wavelength. Examples of the wavelength conversion material may include a quantum dot (QD), a quantum bar or a fluorescent substance. The quantum dot may be a particle material which emits light of a specific wavelength while electrons are transferred from a conduction band to a valence band.

In an embodiment, the quantum dot may be a semiconductor nanocrystalline material. Since the quantum dot has a specific band gap according to the formation and size thereof, the quantum dot may absorb light, and then emit light having an intrinsic wavelength. Examples of the semiconductor nanocrystalline material of the quantum dot may include Group IV nanocrystal, Group II-VI compound nanocrystal, Group III-V compound nanocrystal, Group IV-VI nanocrystal, or a combination thereof.

The color filter 22 may selectively transmit light of a specific color and absorb light of another color, thus blocking the traveling of the light. The light having passed through the color filter 22 may indicate any one of three primary colors, such as red, green, and blue. However, colors of light having passed through the color filter 22 are not limited to three primary colors, and the color filter 22 may indicate any one of cyan, magenta, yellow, and white colors.

Since the color filter 22 absorbs external light at a considerably high level, the reflection of external light may be decreased even if a polarizing unit or the like is not additionally provided.

The window unit 30 may be disposed on the color filter 22, and the color filter 22 and the window unit 30 may be attached to each other with the second adhesive member 82 being interposed therebetween.

In some other embodiments, the sequence of disposition of the wavelength conversion pattern 21 and the color filter 22 may be reversed.

Although some embodiments of the present disclosure have been disclosed, those skilled in the art will appreciate that the present disclosure can be implemented in other forms, without departing from the technical spirit or features of the disclosure as set forth in the accompanying claims. Therefore, it should be understood that the above-described embodiments are provided as examples rather than being restrictive.

What is claimed is:

1. A flexible display device including a bending area and a plurality of non-bending areas, the flexible display device comprising:
  a display substrate comprising a plurality of transistors and a light-emitting element;
  a sensing film below the display substrate and configured to detect input information of an electronic pen; and
  a plurality of metal plates below the sensing film,
  wherein the metal plates comprise a soft magnetic material,
  wherein the plurality of non-bending areas comprises a first non-bending area and a second non-bending area, the bending area being between the first non-bending area and the second non-bending area, wherein the plurality of metal plates comprises a first metal plate configured to overlap with the first non-bending area, and a second metal plate configured to overlap with the second non-bending area, wherein the plurality of metal plates further comprises a third metal plate below the first metal plate, and wherein the plurality of metal plates further comprises a fourth metal plate below the second metal plate.

2. The flexible display device according to claim 1, wherein respective facing ends of the first metal plate and the second metal plate come into contact with each other in a state in which the flexible display device is unfolded.

3. The flexible display device according to claim 2, wherein the respective facing ends overlap with the bending area.

4. The flexible display device according to claim 1, wherein respective facing ends of the first metal plate and the second metal plate are spaced apart from each other by an interval in a state in which the flexible display device is unfolded.

5. The flexible display device according to claim 1, wherein an end of the third metal plate overlaps with at least a portion of the second metal plate.

6. The flexible display device according to claim 1, wherein the sensing film comprises:
a base film;
a first sensing electrode on the base film;
an insulating layer on the first sensing electrode; and
a second sensing electrode on the insulating layer.

7. The flexible display device according to claim 1, wherein each of the plurality of metal plates has a thickness of 20 μm to 150 μm.

8. The flexible display device according to claim 1, wherein the sensing film overlaps with all of the bending area and the plurality of non-bending areas.

9. The flexible display device according to claim 1, wherein the soft magnetic material comprises Invar, ferritic stainless steel, Permalloy, Perminvars, or Permendur.

10. The flexible display device according to claim 1, wherein the input information includes information about a position of the electronic pen on the flexible display device or a touch strength of the electronic pen.

11. A flexible display device including a bending area and a plurality of non-bending areas, the flexible display device comprising:
a display substrate comprising a plurality of transistors and a light-emitting element;
a sensing film below the display substrate; and
a plurality of metal plates below the sensing film,
wherein the metal plates comprise a soft magnetic material, and
wherein the flexible display device has a repulsive force, a strength of which is from 14 N*cm to 20 N*cm at room temperature.

12. A flexible display device that is foldable, comprising:
a display substrate comprising a plurality of transistors and a light-emitting element;
a sensing film below the display substrate and configured to detect input information of an electronic pen;
at least one metal plate below the sensing film; and
a touch sensing layer on the display substrate,
wherein the at least one metal plate comprises a lattice area in which a lattice pattern is defined.

13. The flexible display device according to claim 12, wherein the lattice area has a width of 2 mm to 20 mm.

14. The flexible display device according to claim 12, further comprising an additional metal plate below the at least one metal plate,
wherein the additional metal plate overlaps with the lattice area in a state in which the flexible display device is unfolded.

15. The flexible display device according to claim 12, further comprising:
a wavelength conversion pattern on the touch sensing layer and comprising a quantum dot; and
a color filter on the wavelength conversion pattern.

* * * * *